United States Patent
Chang et al.

(10) Patent No.: US 8,436,392 B2
(45) Date of Patent: May 7, 2013

(54) LIGHT EMITTING DIODE PACKAGE AND MANUFACTURING METHOD THEREOF

(75) Inventors: Chao-Hsiung Chang, New Taipei (TW); Chieh-Ling Chang, New Taipei (TW); Shen-Bo Lin, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 53 days.

(21) Appl. No.: 13/031,582

(22) Filed: Feb. 21, 2011

(65) Prior Publication Data

US 2012/0037947 A1 Feb. 16, 2012

(30) Foreign Application Priority Data

Aug. 16, 2010 (CN) .......................... 2010 1 0254496

(51) Int. Cl.
*H01L 33/48* (2010.01)
*H01L 33/08* (2010.01)

(52) U.S. Cl.
USPC .............. 257/99; 257/E33.056; 257/E33.001; 438/28

(58) Field of Classification Search .................... 257/99, 257/E33.056, E33.001; 438/28
See application file for complete search history.

(56) References Cited

U.S. PATENT DOCUMENTS

| 8,154,033 | B2 | 4/2012 | Liu | |
|---|---|---|---|---|
| 2006/0261451 | A1* | 11/2006 | Nakatsu et al. | 257/673 |
| 2008/0099898 | A1* | 5/2008 | Cui et al. | 257/678 |
| 2009/0022198 | A1 | 1/2009 | Chen et al. | |
| 2010/0078655 | A1* | 4/2010 | Yang | 257/81 |
| 2011/0037079 | A1* | 2/2011 | Lee | 257/88 |
| 2012/0018906 | A1* | 1/2012 | Mino et al. | 257/789 |

FOREIGN PATENT DOCUMENTS

| TW | 200905907 A | 2/2009 |
|---|---|---|
| TW | 201025671 A | 7/2010 |

* cited by examiner

*Primary Examiner* — Victor A Mandala
*Assistant Examiner* — Whitney T Moore
(74) *Attorney, Agent, or Firm* — Altis Law Group, Inc.

(57) ABSTRACT

A light emitting diode package comprises a substrate with a first surface and a second surface opposite to each other, a circuit on the substrate, a support on the substrate for reinforcing strength of the substrate, a plurality of light emitting diodes on the substrate and electrically connected to the circuit, and a cover layer on the plurality of light emitting diodes. A method for manufacturing a light-emitting diode package is further provided.

20 Claims, 6 Drawing Sheets

US 8,436,392 B2

LIGHT EMITTING DIODE PACKAGE AND MANUFACTURING METHOD THEREOF

TECHNICAL FIELD

The disclosure relates generally to semiconductor device technology, and more particularly to a light emitting diode package and manufacturing method thereof.

DESCRIPTION OF THE RELATED ART

With progress in technologies LEDs, substrates thereof are provided with more compact and slimmer profiles. In the manufacturing process, a resin or plastic substrate is provided with a circuit allocated thereon, and a plurality of LEDs is disposed on the substrate electrically connecting to the circuit. The plurality of LEDs is encapsulated by a cover layer and the substrate cut into multiple devices instantaneously. However, minimized thickness of the substrate reduces rigidity with bending or unevenness resulting. Defective fraction of the manufacturing process of the LED is further more pronounced. Hence, what is needed is a light emitting diode package and manufacturing method thereof which can overcome the described limitations.

DETAILED DESCRIPTION

Figure 1:
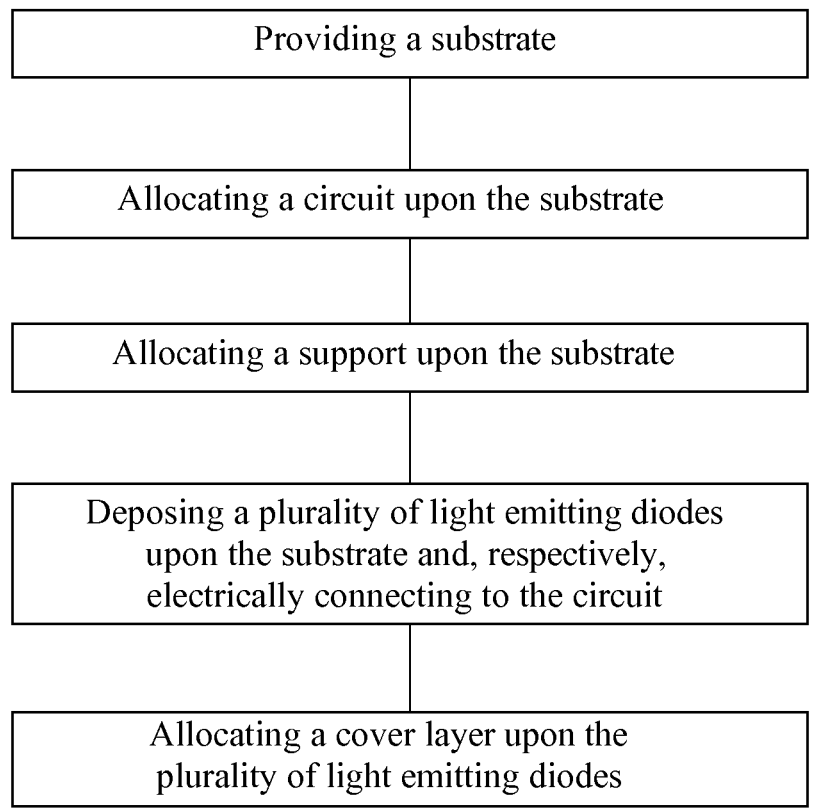
FIG. 1 is a flowchart of a method for manufacturing a light emitting diode package of the disclosure.

As shown in FIG. 1, the disclosure provides a method for manufacturing a light emitting diode package as follows.

In step 102, a substrate is provided.

In step 104, a circuit is allocated on the substrate.

In step 106, a support is allocated on the substrate for reinforcing strength of the substrate.

In step 108, a plurality of light emitting diodes is disposed on the substrate and, respectively, electrically connecting to the circuit.

In step 110, a cover layer is allocated on the plurality of light emitting diodes.

Exemplary embodiments of the disclosure are here described with reference to FIG. 2.

Figure 2:
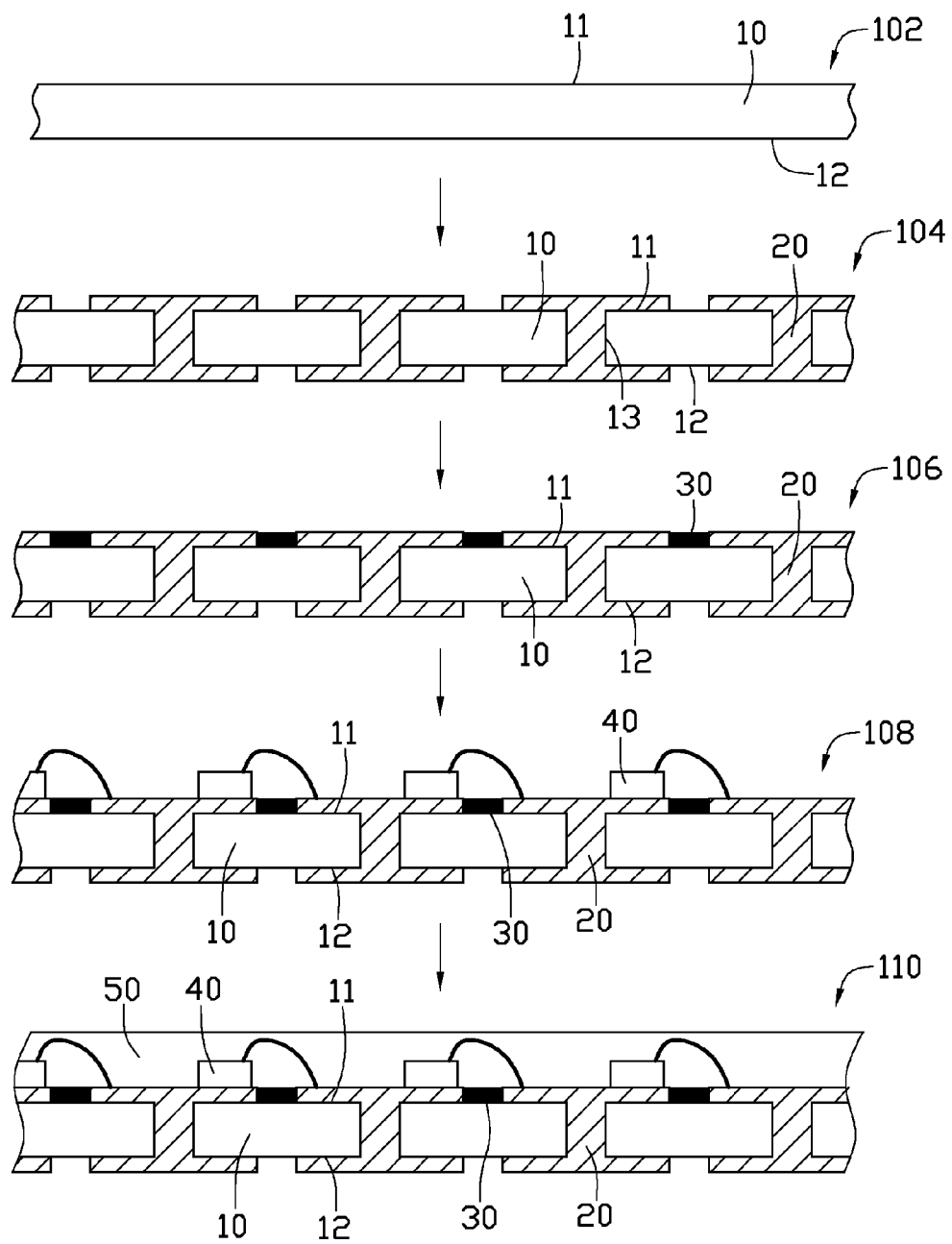
FIG. 2 is a schematic diagram of a light emitting diode package manufactured by a method, such as, for example, that of FIG. 1.
Figure 3:
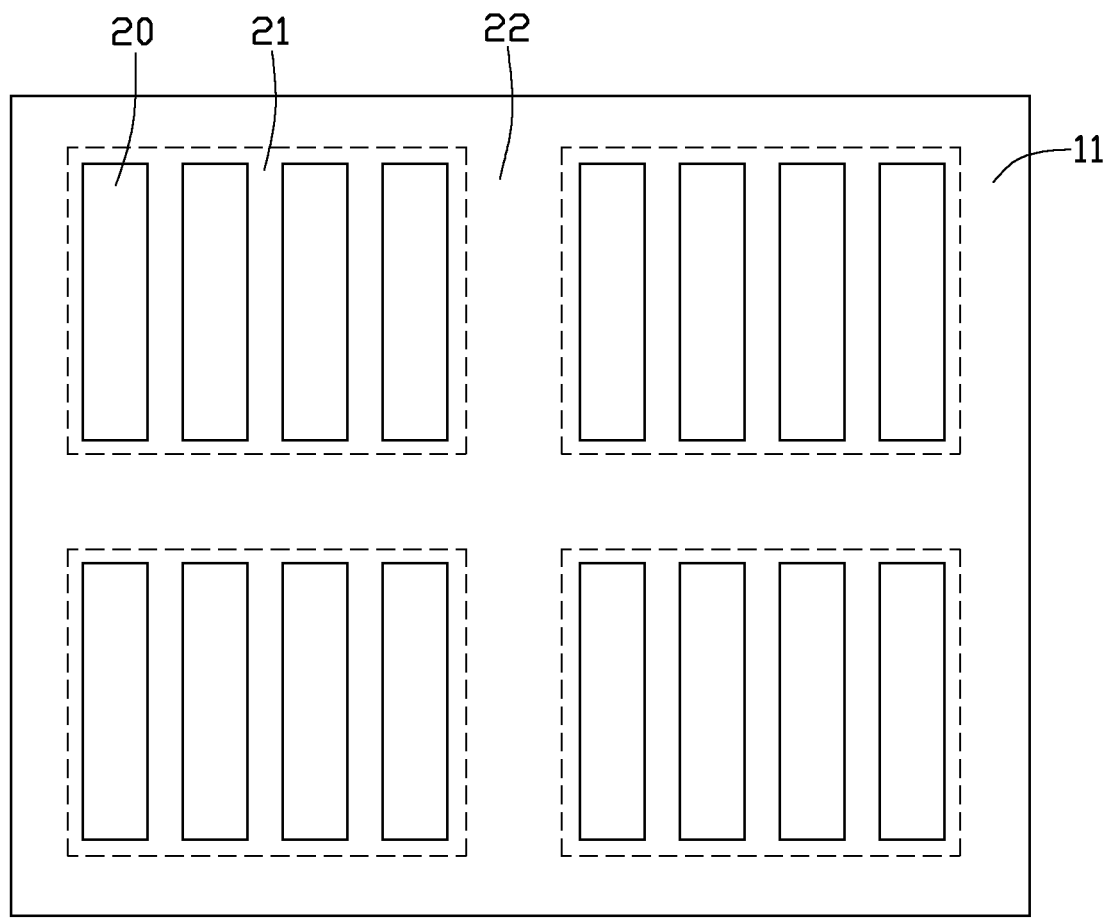
FIG. 3 is a top view of a substrate with a circuit in accordance with step 104 of the method for manufacturing the light emitting diode package.

As shown in FIG. 2 and FIG. 3, the substrate 10 is a plane with a first surface 11 and a second surface 12 opposite to the first surface 11. In step 102, the substrate 10 is provided, comprising multiple functional regions 21 and a non-functional region 22 isolating the functional regions 21 into multiple parts. In the disclosure, each of the functional regions 21 is surrounded by the non-functional region 22. Alternatively, the non-functional region 22 can be allocated merely between the multiple functional regions 21. Specifically, the substrate 10 is resin or plastic.

In step 104, the circuit 20 is allocated on the first surface 11 of the substrate 10 and extends from the first surface 11 to the second surface 12. In the disclosure, the circuit 20 is allocated within the multiple functional regions 21. Further, in the manufacturing of the circuit 20 of the disclosure, a plurality of holes 13 is formed on the substrate 10, wherein the plurality of holes 13 penetrates the substrate 10 from the first surface 11 to the second surface 12. Specifically, the plurality of holes 13 is formed by mechanical or laser drilling or chemical etching. The circuit 20 is formed on the first surface 11, the second surface 12 and inside the plurality of holes 13 by evaporation, sputtering or electric plating, and etching. Alternatively, a plurality of depressions (not shown) is formed on the first surface 11 of the substrate 10, by mechanical or laser drilling, or chemical etching, wherein the plurality of light emitting diodes 40 is disposed inside the depressions. The depressions are configured for collecting light emitted in a desired direction and accommodating the light field, whereby the light emitting efficiency of the light emitting diode package is enhanced.

Figure 4:
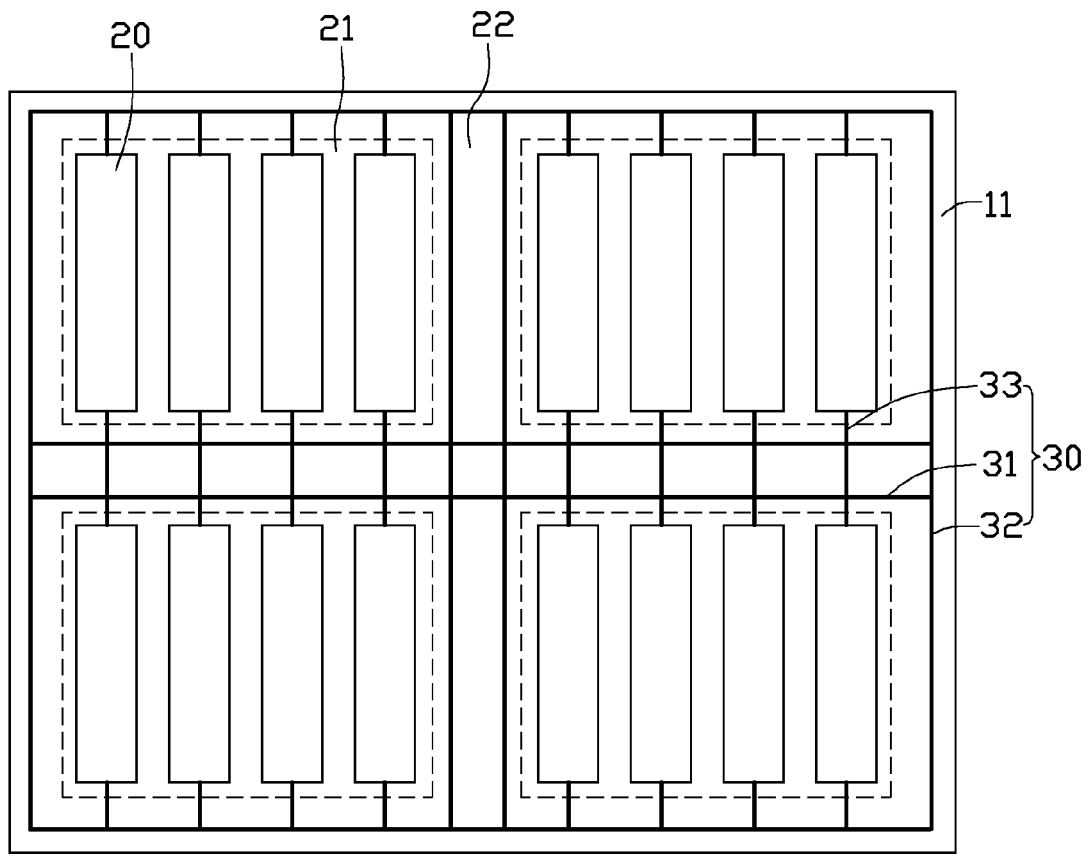
FIG. 4 is a top view of a substrate with a support in accordance with step 106 of one embodiment of the method for manufacturing the light emitting diode package.
Figure 5:
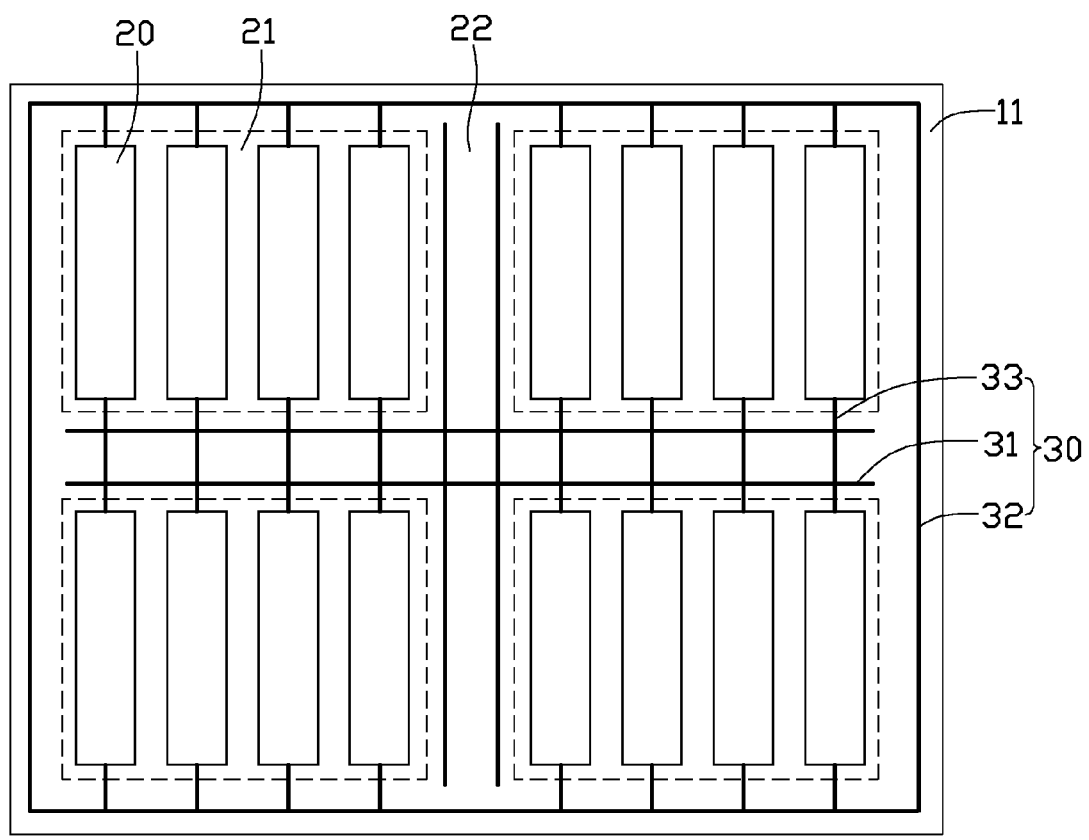
FIG. 5 is a top view of the substrate with a support in accordance with step 106 of another embodiment of the method for manufacturing the light emitting diode package.

In step 106, the support 30 is allocated on the substrate 10. As shown in FIG. 4, the support 30 comprises a plurality of braces 31, an outer edge 32 and a plurality of traces 33. The braces 31 are disposed on the non-functional region 22 between the multiple functional regions 21. The outer edge 32 is disposed around the rim of the substrate 10, wherein the multiple functional regions 21 are surrounded by the outer edge 32. In the disclosure, the braces 31 can connect to the outer edge 32, or alternatively, not, as shown in FIG. 5. The traces 33 extend from the multiple functional regions 21 to the non-functional region 22, wherein the traces 33 and the braces 31 intersect. Optionally, the support 30 can be allocated on the first surface 11, the second surface 12 or both. Specifically, the support 30 is metal formed by evaporation, sputtering or electric plating, and etching, wherein the support 30 can be formed by the manufacturing process of the circuit 20. Otherwise, the support 30 can be resin or plastic formed by printing following the manufacturing process of the circuit 20. Additionally, for reduced use of raw materials, the support 30 can comprise merely one of the braces 31, the outer edge 32 and the traces 33. The support 30 is configured for increasing the rigidity of the substrate 10 and to absorb stress or tension to avoid the strain from the substrate 10.

Figure 6:
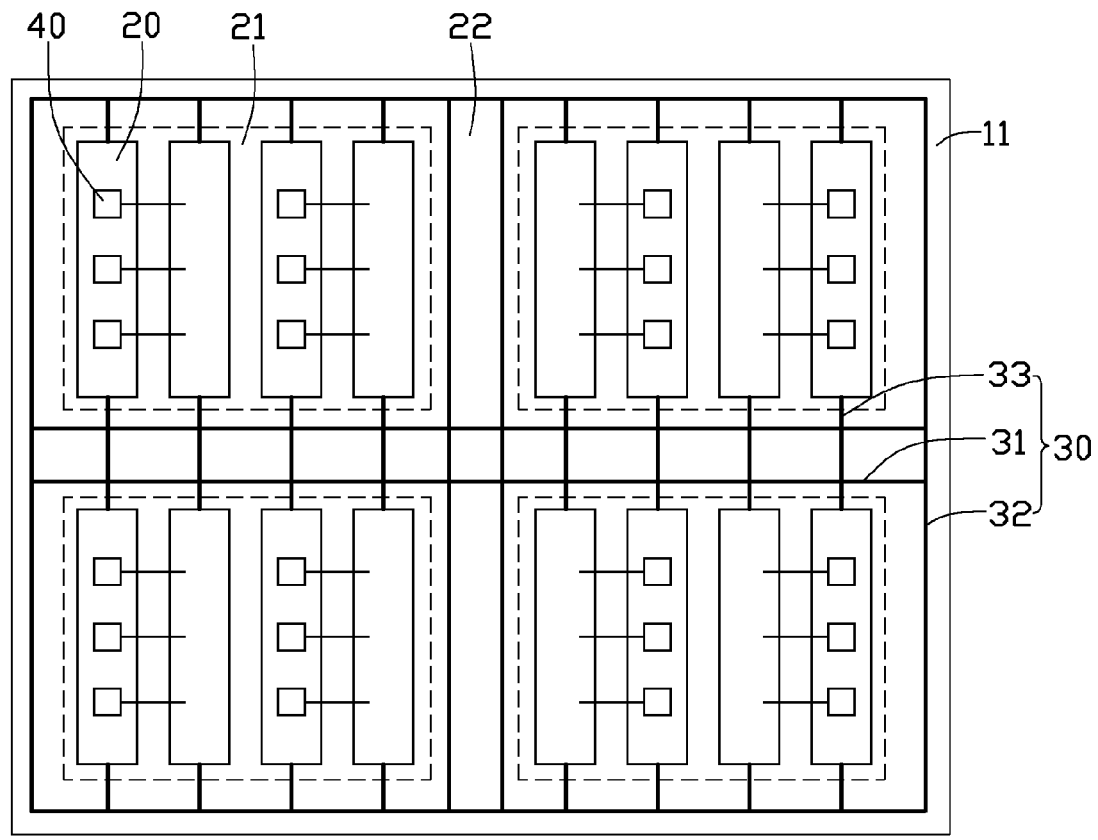
FIG. 6 is a top view of the substrate with a plurality of LEDs in accordance with step 108 of the method for manufacturing the light emitting diode package.

In step 108, the plurality of light emitting diodes 40 is disposed on the substrate 10 and, respectively, electrically connecting to the circuit 20, as shown in FIG. 6. The plurality of light emitting diodes 40 is disposed within the multiple functional regions 21. In the disclosure, the plurality of light emitting diodes 40 electrically connects to the circuit 20 by conductive wire; alternatively, it also can be implemented by flip chip or eutectic.

In step 110, the cover layer 50 is allocated on the plurality of the light emitting diodes 40. Specifically, the cover layer 50 is silicone, epoxy or any transparent material formed by molding. In the disclosure, the cover layer 50 comprises luminescent conversion element (not shown) such as YAG, TAG, silicate, nitride, nitrogen oxides, phosphide and sulfide.

The substrate 10 is cut into multiple devices (not shown), each comprising at least one light emitting diode 40.

It is to be understood, however, that even though multiple characteristics and advantages of the disclosure have been set forth in the foregoing description, together with details of the structure and function of the invention disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a light emitting diode package, comprising:
    providing a substrate with a first surface and a second surface opposite to each other;
    disposing a circuit on the substrate, the circuit extending from the first surface to the second surface;
    disposing a support on the substrate for reinforcing mechanical strength of the substrate, wherein the support is located in a recess defined between the circuit and the first surface of the substrate;
    disposing a plurality of light emitting diodes on the substrate and, respectively, electrically connecting to the circuit; and
    allocating a cover layer on the plurality of light emitting diodes to cover the light emitting diodes and the support.

2. The method for manufacturing the light emitting diode package as claimed in claim 1, wherein the substrate comprises multiple functional regions and a non-functional region dividing the functional region into multiple parts.

3. The method for manufacturing the light emitting diode package as claimed in claim 2, wherein the circuit is disposed on the multiple functional regions.

4. The method for manufacturing the light emitting diode package as claimed in claim 2, wherein the support comprises a plurality of braces disposed on the non-functional region between the multiple functional regions.

5. The method for manufacturing the light emitting diode package as claimed in claim 4, wherein the support comprises a plurality of traces extending from the multiple functional regions to the non-functional region, and the plurality of traces and the plurality of braces intersect.

6. The method for manufacturing the light emitting diode package as claimed in claim 4, wherein the support comprises an outer edge surrounding the multiple functional regions.

7. The method for manufacturing the light emitting diode package as claimed in claim 6, wherein the plurality of braces and the outer edge connect each other.

8. The method for manufacturing the light emitting diode package as claimed in claim 1, wherein the support is disposed on the first surface and the second surface.

9. The method for manufacturing the light emitting diode package as claimed in claim 1, wherein the support is metal configured by evaporation, sputtering or electric plating.

10. The method for manufacturing the light emitting diode package as claimed in claim 9, wherein the support and the circuit are integrated.

11. The method for manufacturing the light emitting diode package as claimed in claim 1, wherein the support is plastic or resin formed by printing.

12. The method for manufacturing the light emitting diode package as claimed in claim 1, further comprises a step of cutting the substrate into multiple devices after the cover layer is allocated on the plurality of light emitting diodes, wherein each of the devices comprises at least one light emitting diode.

13. A light emitting diode package substrate, comprising:
    a substrate, having as first surface and a second surface opposite to each other;
    a circuit, disposed on the substrate, extending from the first surface to the second surface;
    a support, disposing on the substrate and located in a recess defined between the first surface of the substrate and the circuit, the support comprising a plurality of braces, an outer edge and a plurality of traces, for reinforcing mechanical strength of the substrate; and
    a cover layer on the plurality of light emitting diodes to cover the light emitting diodes and the support.

14. The light emitting diode package substrate as claimed in claim 13, wherein the substrate comprises multiple functional regions and a non-functional region dividing the functional region into multiple parts.

15. The light emitting diode package substrate as claimed in claim 14, wherein the braces are disposed on the non-functional region between the multiple functional regions.

16. The light emitting diode package substrate as claimed in claim 14, wherein the outer edge is disposed around the rim of the substrate, wherein the multiple functional regions are surrounded by the outer edge.

17. The light emitting diode package substrate as claimed in claim 14, wherein the traces extend from the multiple functional regions to the non-functional region.

18. The light emitting diode package substrate as claimed in claim 13, wherein the support is formed in the manufacturing process of the circuit.

19. The light emitting diode package substrate as claimed in claim 13, wherein the support is allocated on the first surface and the second surface.

20. The light emitting diode package substrate as claimed in claim 13, wherein the support is metal, resin or plastic.

* * * * *